(12) United States Patent
Sullivan et al.

(10) Patent No.: US 6,399,934 B1
(45) Date of Patent: Jun. 4, 2002

(54) OPTICAL COUPLING TO GATED PHOTOCATHODES

(75) Inventors: Jeffrey S. Sullivan, Hayward; Steven Coyle, Alameda; Andres Fernandez, Dublin; Marian Mankos, San Francisco, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 24 days.

(21) Appl. No.: 09/642,525

(22) Filed: Aug. 18, 2000

(51) Int. Cl.[7] .................................... H01J 40/14
(52) U.S. Cl. ........................ 250/214 R; 250/214.1; 257/433
(58) Field of Search ................. 250/214 R, 214 P, 250/205, 214.1, 216, 208.1; 257/81, 82, 431–435, 433

(56) References Cited

U.S. PATENT DOCUMENTS 4,264,857 A  *  4/1981  Jambotkar ............... 323/326

* cited by examiner

Primary Examiner—Que T. Le

(57) ABSTRACT

An electron source is disclosed in which control signals having transition times less than about 10 nanoseconds and electrically isolated from a gated photocathode control an electron beam supplied by the gated photocathode. In one embodiment, the electron source includes a transmissive substrate, a photoemitter on the substrate, a gate insulator on the photoemitter, a gate electrode on the gate insulator, a housing enclosing the photoemitter and the gate electrode, a light source located outside the housing, and a detector located in the housing to receive light from the light source. The detector is electrically coupled to control a voltage applied to one of the gate electrode or the photoemitter.

22 Claims, 9 Drawing Sheets

OPTICAL COUPLING TO GATED PHOTOCATHODES

STATEMENT REGARDING FEDERALLY SPONSORED RESEARCH

Subject matter of this disclosure was made with government support under contract number DARPA BAA99-14 awarded by the Defense Advanced Research Projects Agency. The U.S. Government may have certain rights to the subject matter.

FIELD OF THE INVENTION

The present disclosure relates generally to electron beam sources and, more particularly, to electron beam sources including photocathodes for the generation of electron beams.

DESCRIPTION OF RELATED ART

High resolution electron beam sources are used in systems such as scanning electron microscopes, defect detection instruments, VLSI testing equipment, and electron beam (e-beam) lithography. In general, e-beam systems include an electron beam source and electron optics. The electrons are accelerated from the source and focused to define an image at a target.

In applications such as electron beam lithography, for example, it is often desirable to modulate an electron beam so as to control a dose of electrons delivered to a pixel on the target. Preferably, the electron beam is modulated to address more than about 100 megapixels per second (corresponding to more than 100 megabits per second in a digital implementation) to thereby rapidly communicate a pattern to the target. Such high pixel throughput typically requires that the electron beam be modulated with a digital signal having (20%–80%) rise and fall times less than about 10 nanoseconds (ns), or an analog signal having transition times between pixel levels less than about 10 ns.

In electron beam sources such as those disclosed, for example, in Aton et al. U.S Pat. No. 5,156,942 and in Baum et al. U.S. Pat. No. 5,684,360, electron beams are generated by light beams incident on a photocathode. These electron beams may be modulated by modulating the light beams. Alternatively, Lee et al. U.S. patent application Ser. No. 09/052,903, filed Mar. 31, 1998, assigned to the assignee of the present application, and incorporated herein by reference in its entirety, and the corresponding Lee et al. International Patent Application Ser. No. PCT/US99/05584, filed Mar. 16, 1999, assigned to the assignee of the present application, published Oct. 7, 1999 as International Publication Number WO 99/50874, and also incorporated herein by reference, disclose photocathodes having gate electrodes. An electron beam supplied by such a gated photocathode is electrically (not optically) modulated by controlling a voltage between the gate electrode and a photoemitter in the photocathode of, e.g., about ±5 volts.

Both the gate electrode and the photoemitter in such a gated photocathode are typically operated at voltages of, e.g., tens of kilovolts with respect to ground voltage. In contrast, control systems controlling the gate and photoemitter voltages typically operate at voltages near ground voltage. Consequently, the control systems must be electrically isolated from the high voltages.

High voltage components of electron sources have previously been isolated from low voltage control systems with, e.g., optical isolation systems operating at low signaling speeds. For example, Hartle U.S. Pat. No. 5,808,425 discloses an electron source in which a low bandwidth feedback system employing optical isolation regulates the level of a cathode emission current. Similarly, Fish U.S. Pat. No. 6,072,170 discloses a cathode switch employing optical isolation for an image intensifier tube. This cathode switch is rather slow, having, a turn on time of about 50 nanoseconds (ns) and a turn off time of about 300 ns.

What is needed is an electron source suitable for high speed operation and control, e.g., for lithography.

SUMMARY

An electron source is disclosed in which an electron beam is controlled optically by providing a beam of light outside a housing, detecting a portion of the beam of light inside the housing, thereby receiving a signal which is a series of pulses, each pulse having a rise time and a fall time each less than about 10 nanoseconds, and controlling a difference between a voltage applied to a photoemitter inside the housing and a voltage applied to a gate electrode inside the housing in response to the signal. This is in the context of a digital (pulsed) signal. However, it will be apparent that the signal may be an analog signal having an equivalent information carrying capacity, and characterized by the same rise and fall (transition) times.

In a first embodiment, the electron source includes a transmissive substrate, a photoemitter on the substrate, a gate insulator on the photoemitter, a gate electrode on the gate insulator, a housing enclosing the photoemitter and the gate electrode, a light source outside the housing, and a detector in the housing located to receive light from the light source. The detector is electrically coupled to control a voltage applied to one of the gate electrode or the photoemitter.

In one embodiment, the light source includes a laser and an electroabsorption optical modulator located to modulate an output of the laser. Other embodiments include additional light sources, detectors, photoemitters, and gate electrodes. In one embodiment, light output from a first light source is combined by an optical multiplexer with light output from a second light source.

The inventors have recognized that high pixel throughput in, e.g., an electron beam lithography system employing a gated photocathode requires communication of control signals having very short rise and fall times to the photoemitter or gate electrode. The inventors have further recognized that communication of such control signals can be accomplished with optical technology developed for use in telecommunications, such as electroabsorption modulated lasers.

Optical communication of control signals to a photoemitter or gate electrode in an electron source electrically isolates high voltages from ground-referenced low voltage signals controlling, e.g., light sources. Such electrical isolation improves operator safety, and reduces the complexity of designing and fabricating gated photocathode electron sources. In addition, high bandwidth optical communication of control signals reduces the length over which very high frequency and high voltage electrical signals are transmitted to photoemitters or gate electrodes, and thus reduces radio frequency cross-talk between those signals.

DETAILED DESCRIPTION

Figure 1:
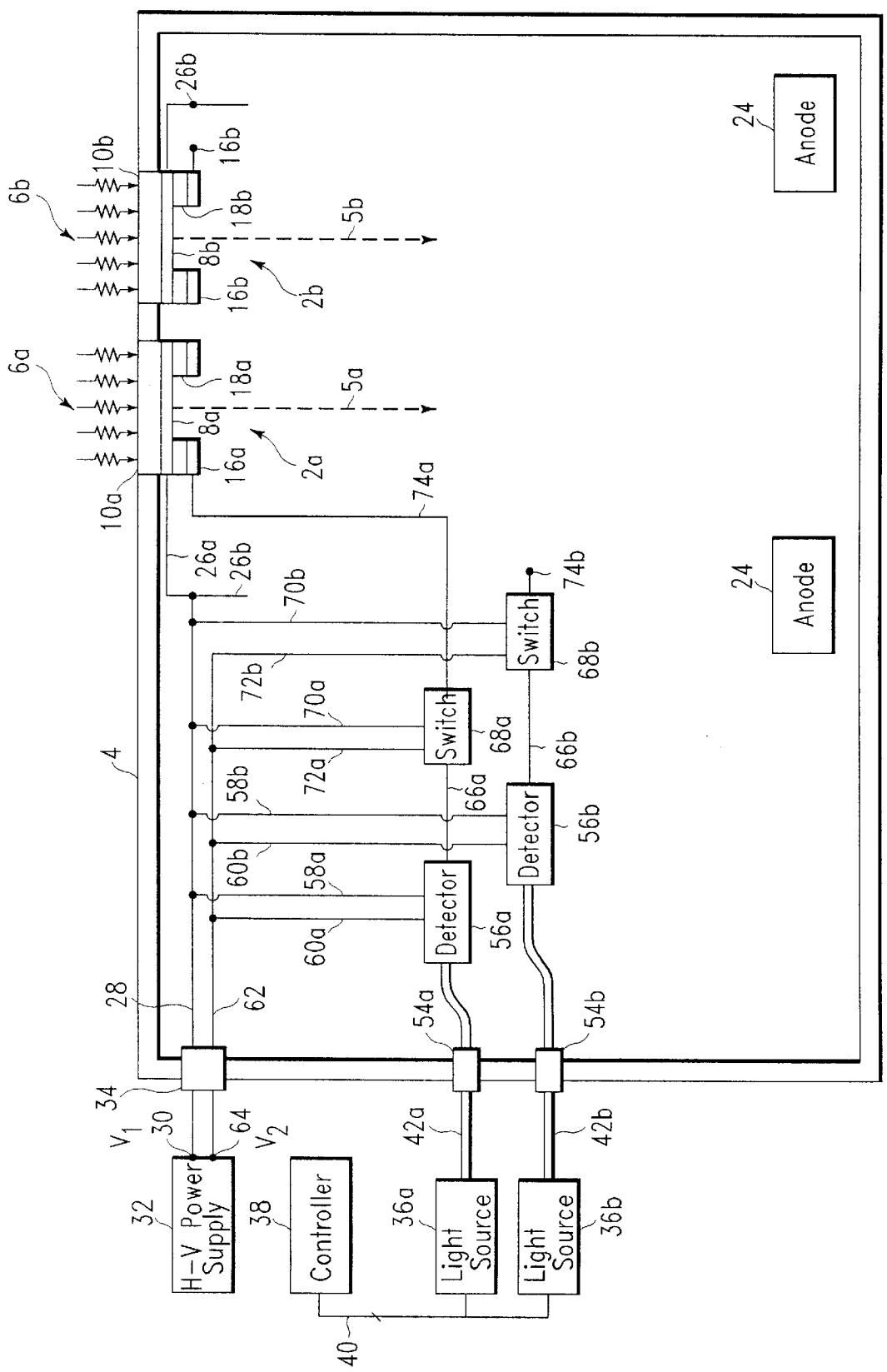
FIG. 1 is an illustration of one embodiment of the present apparatus.

Referring to FIG. 1, in one embodiment of the present apparatus, one or more gated photocathodes 2a–2b are located in conventional vacuum chamber 4 to output electron beams 5a–5b in response to light beams 6a–6b. Light beams 6a–6b are emitted by, e.g., lasers, lamps, or other conventional light sources (not shown). Other embodiments also include conventional electron optics located in vacuum chamber 4 to scan the electron beams output by gated photocathodes 2a–2b over a target substrate in, e.g., a conventional electron beam lithography process. Hence vacuum chamber 4 houses an electron beam column. Though for convenience of illustration FIG. 1 shows two gated photocathodes, other implementations employ either more or fewer gated photocathodes. The structure and operation of gated photocathode 2a in one embodiment are disclosed below with reference to FIGS. 2A and 2B. The structure and operation of gated photocathode 2b are substantially similar or identical to the structure and operation of gated photocathode 2a. Like numbers in the various figures designate the same parts in the various embodiments. The remaining conventional elements of the electron beam column, including lenses, deflectors, target stage, etc., are not shown.

Figure 2A:
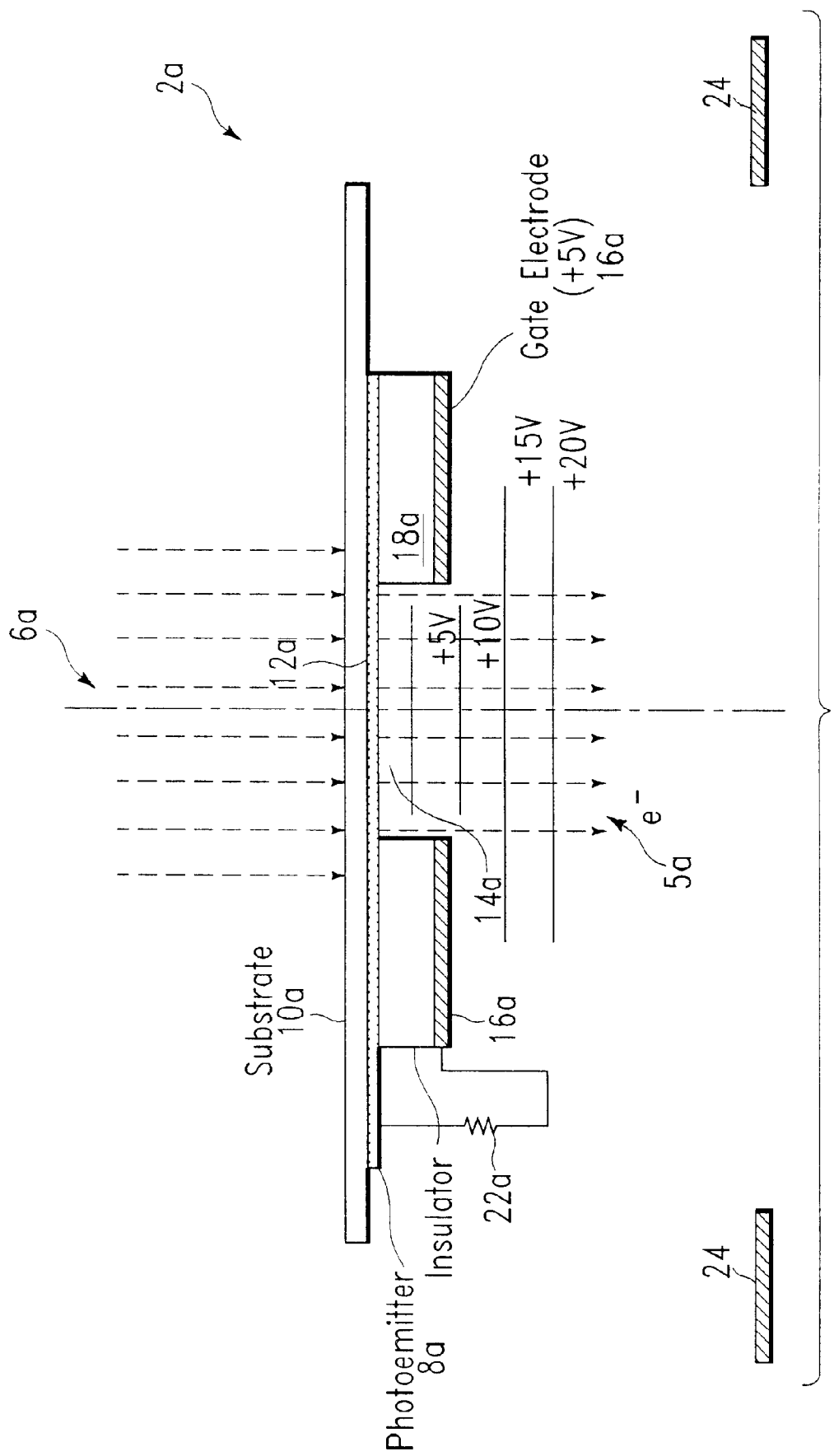
FIGS. 2A and 2B are side views of a gated photocathode of FIG. 1.
Figure 2B:
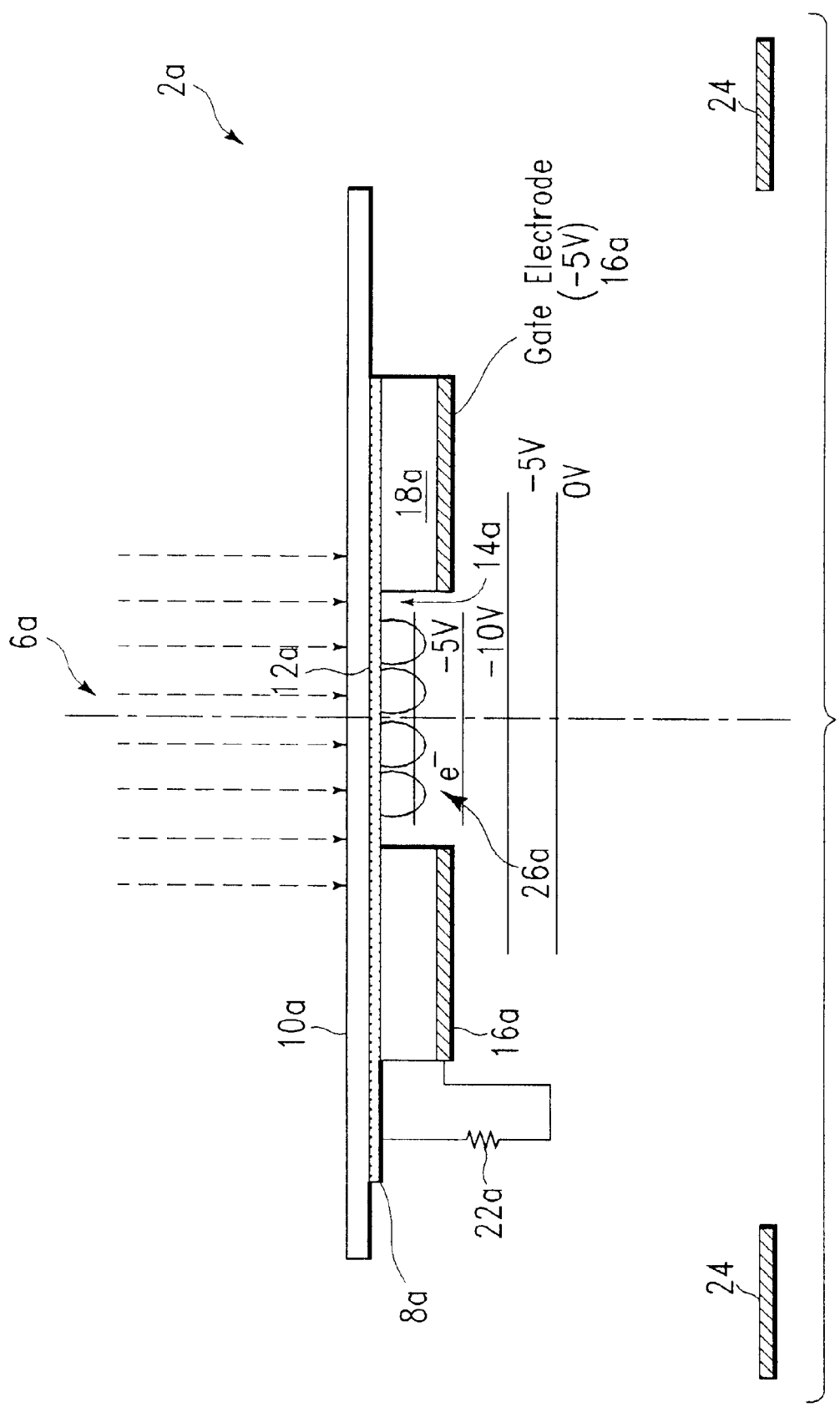

Referring to FIGS. 2A and 2B, a photoemitter 8a is deposited on a transmissive substrate 10a in gated photocathode 2a. Transmissive substrate 10a is usually glass, fused silica or sapphire, although other transmissive materials having structural strength sufficient for support can be used. (The gated photocathode-photoemitter combination is of the type described above.)

Light beam 6a is incident on transmissive substrate 10a, passes through transmissive substrate 10a, and is absorbed by photoemitter 8a at irradiation region 12a. Photoemitter 8a emits electrons from emission area 14a, located on the surface of photoemitter 8a opposite of irradiation region 12a, when light beam 6a is incident upon irradiation region 12a.

Emission area 14a is, in general, of any shape and any size where gate electrode 16a determines the electric field. Some useful shapes include a circle, a square, a rectangle, an octagon and a hexagon. Irradiation region 12a should at least cover emission area 14a.

A gate insulator 18a is deposited on photoemitter 8a such that emission area 14a is surrounded, but not covered, by gate insulator 18a. Gate insulator 18a may be made from any electrically insulating material and is preferably made from $SiO_2$. Gate electrode 16a is deposited on the side of gate insulator 18a away from emission region 14a. Gate electrode 16a is made from any conducting material.

Photoemitter 8a is made from any material that emits electrons when illuminated. Photoemitting materials include gold, aluminum, magnesium, and carbide materials. In addition, semiconductors, such as GaAs, are suitable photoemitter materials. Preferably, photoemitter 8a is made from magnesium and has a thickness of about 100 Å.

Photoemitter 8a has a work function that is determined by the particular photoemitter material. The work function is the minimum energy required to release an electron from the material. The photons in light beam 6a have an energy at least as great as the work function for photoemitter 8a to emit electrons.

Light beam 6a is absorbed by photoemitter 8a at, or nearly at, the surface of photoemitter 8a corresponding to irradiation region 12a. These electrons migrate from irradiation region 12a to emission area 14a and are emitted from the material at emission area 14a provided that the electrons have not lost too much energy to collisions within the photoemitter material. At that point, electrons will have a kinetic energy no greater than the photon energy minus the work function. As such, the thickness of photoemitter 8a should be sufficient to absorb light beam 6a but not so thick as to reabsorb a significant number of the free electrons created.

It is also desirable that the kinetic energies of the emitted electrons not be too large, preferably less than 0.5 eV but as large as a few eV, so that the emitted electrons can be reflected by a voltage applied to gate electrode 16a. If photoemitter 8a is magnesium, then a light beam having a photon wavelength of 344 nm or less is needed to produce photons having an appropriate photon energy. Preferably light with a wavelength of 257 nm is used because it is available from frequency doubled argon ion lasers.

Transmissive substrate 10a is transmissive to light beam 6a so that the maximum amount of light possible is incident on irradiation region 12a. Transmissive substrate 10a can be of any thickness but preferably is less than a few millimeters thick. In addition, light beam 6a may be focused to cover irradiation spot 12a in an area corresponding to emission region 14a.

The intensity distribution of light beam 6a is generally Gaussian in shape, therefore light beam 6a will be more intense at its center than at its edges. Light beam 6a is preferably focused in such a way that its intensity is nearly uniform across irradiation region 12a so that electron beam 5a has nearly uniform intensity. In general, however, light beam 6a can be as focused as is desired.

Gate electrode 16a is mounted to insulator 18a and can be constructed from any conducting material. The thickness of gate insulator 18a is preferably about 1000 Å and the thickness of gate electrode 16a is also preferably about 1000 Å. In one embodiment, photoemitter 8a is held at a voltage of from a few kilovolts (kV) to several tens of kilovolts below ground voltage, e.g., at about −50 kV with respect to ground voltage. Gate electrode 16a is biased at a voltage greater than the photoemitter voltage, e.g., at approximately +5 V with respect to photoemitter 8a, in order to accelerate the electrons that are emitted from photoemitter 8a. Alternatively, gate electrode 16a is biased at voltages less than the photoemitter voltage, e.g., at approximately −5 V with respect to photoemitter 8a, in order to reflect the emitted electrons back towards photoemitter 8a. Stable emission can be achieved by coupling a resistor 22a between photoemitter 8a and gate electrode 16a and using the emission-intensity for feed-back (i.e., a self-biasing system). For example, when electron emission increases the gate voltage decreases correspondingly which in turn lowers the emission intensity.

Anode electrode 24 is held at ground voltage and accelerates the electrons out of photocathode 2a. In one implementation, the electrons are accelerated into a conventional downstream evacuated electron beam column (not shown).

In FIG. 2A, showing a side view of the gated photocathode of FIG. 1, gate electrode 16a is held at +5 V. This voltage is chosen so as to be approximately consistent with the electric field which would be set up between anode electrode 24 and photoemitter 8a if insulator 18a and gate electrode 16a were absent. With the voltage of gate electrode 16a at +5 V with respect to photoemitter 8a, electron beam 5a, which carries the image of emission region 14a, is accelerated out of emission region 14a. Insulators 18a and gate electrode 16a also act as an aperture in order to better shape the image of emission region 14a contained in electron beam 5a.

In FIG. 2B (showing the identical structure as FIG. 2A), gate electrode 16a is held at −5 V with respect to photoemitter 8a. At this voltage, the electrons emitted by emission region 14a are accelerated back towards emission region 14a by the electric field created between gate electrode 16a and photoemitter 8a. No electron beam 5a is created because the electrons emitted from emission region 14a are reflected back into photoemitter 8a rather than being accelerated away from photoemitter 8a. Instead of an electron beam, space charge 26a is created where electrons are emitted out of photoemitter 8a and promptly accelerated back into photoemitter 8a.

In some embodiments, the voltage at gate electrode 16a is varied in order to control the intensity of the electron beam 5a. The higher the voltage difference between gate electrode 16a and photoemitter 8a the greater the number of electrons that leave photocathode 2a. The maximum number of electrons available, of those that are emitted from emission region 14a as a result of light beam 6a, are extracted when the gate electrodes are set at full on (about +5 V with respect to photoemitter 8a).

Although the examples shown here have the gate biasing voltage at +5 V for full-on operation and −5 V for full-off operation, other parameters for gate voltages are possible. The full-on bias voltage and the voltage applied to anode electrode 24 determine the thickness of insulator 18a if the electric field created by gate electrode 16a at the full-on bias voltage is to be consistent with that field which would exist in the absence of gate electrode 16a and gate insulator 18a. Gate electrode 16a need not be positioned such that the accelerating field in the full-on case is approximately equal to the field were gate electrode 16a absent, though. More fundamentally, the full-on voltage determines a minimum thickness of gate insulator 18a necessary to prevent dielectric breakdown. The full-off bias voltage limits the incident light beam photon energy because in full-off operation the electrons emitted from emission region 14a must be reflected back into photoemitter 8a. In addition, gate electrode 16a should be the dominant feature determining the electric fields near emission region 14a. The size of emission region 14a is therefore limited by the relative sizes and distances between gate electrode 16a and anode electrode 24.

In embodiments where switching times are important, the RC (resistance capacitance) time constant of gate electrode 16a should be relatively small. The spacing between gate electrodes, the spacing between the gate electrode and the photoemitter, and the thickness of the electrodes determine the RC time constant and therefore the maximum rate of switching.

Referring again to FIG. 1, in one embodiment photoemitter 8a in gated photocathode 2a is electrically coupled by electrical lines 26a and 28 to output terminal 30 of a conventional high voltage (HV) power supply 32 to receive therefrom a direct current (DC) at voltage $V_1$. As disclosed above, the voltage $V_1$ is, e.g., about −50 kV with respect to ground voltage. HV power supply 32 is, e.g., any conventional HV power supply suitable to supply currents of about a microamp to about a milliamp at voltages of a few kV to tens of kV to a photocathode in an electron beam source. Photoemitter 8b in gated photocathode 2b is similarly electrically coupled by electrical lines 26b and 28 to output terminal 30 of HV power supply 32 at voltage $V_1$. Electrical line 28 enters vacuum chamber 4 through conventional HV vacuum feedthrough 34. Though, for convenience of illustration only, a portion of line 26b is not shown in FIG. 1, lines 26b and 28 form a continuous electrical connection between photoemitter 8b and output terminal 30.

In one embodiment, a voltage on gate electrode 16a of gated photocathode 2a is controlled optically, as follows, to thereby control an intensity of an electron beam supplied by photocathode 2a.

Light source 36a receives electrical signals from light source controller (e.g., a processor or rasterizer) 38 via bus 40 and in response outputs into optical fiber 42a a light beam having an intensity modulation corresponding to a desired modulation of the electron beam, e.g., electron beam 5a in FIG. 2A, output from gated photocathode 2a. Optical fiber 42a is an electrically insulating conventional optical fiber made of, e.g., optical glass. Optical fiber 42a is either a single mode or a multimode optical fiber.

The output of light source 36a is modulated with a signal having rise and fall times less than about 10 ns, preferably less than about 1 ns, more preferably less than about 100 picoseconds (ps). In one implementation, light source 36a is, e.g., a laser diode to which a modulated electrical drive current is supplied to thereby modulate the laser diode's output. In another implementation, light source 36a is a laser such as an argon ion laser or a laser diode having an output modulated by an acousto-optical modulator (not shown) capable of modulating the laser's output with a signal having rise and fall times less than about 10 ns. In another implementation, light source 36a is a laser such as an argon ion laser or a laser diode having an output modulated by an electroabsorption optical modulator capable of modulating the laser's output with a signal having rise and fall times less than about 40 picoseconds (ps).

Figure 3:
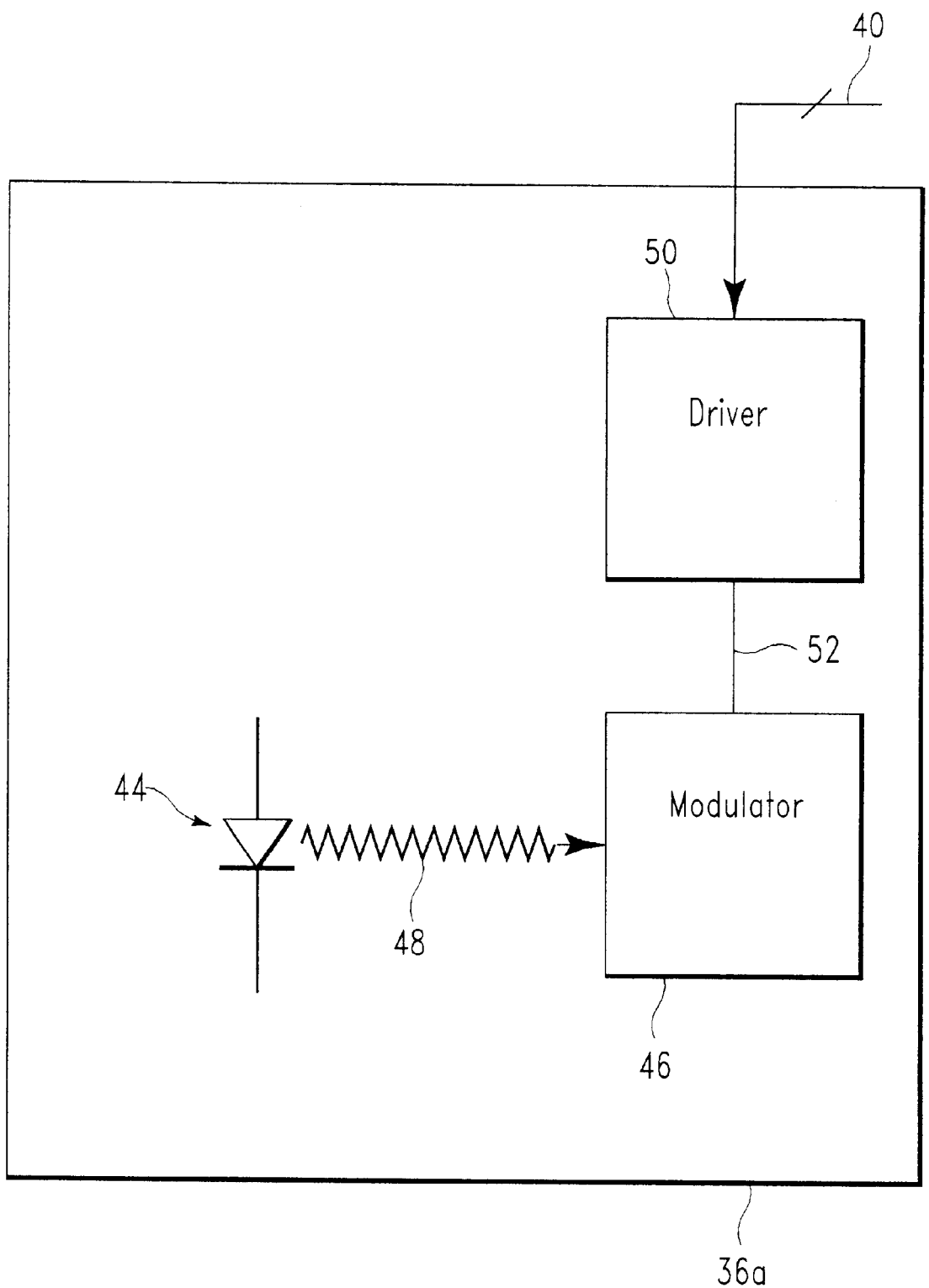
FIG. 3 is a block diagram illustration of a light source of FIG. 1.

Referring to FIG. 3, showing detail of FIG. 1, in one embodiment light source 36a includes a laser diode 44, an electroabsorption optical modulator 46 located to modulate a light beam 48 output by laser diode 44, and a modulator driver 50 electrically coupled by electrical line 52 to electroabsorption optical modulator 46 to provide thereto a modulation voltage corresponding to a desired modulated light output. This embodiment is implemented with, e.g., an E2580-series electroabsorption modulated laser, available from Lucent Technologies and developed for high-speed telecommunications applications, which integrates in a single module a continuous wave laser 44, an electroabsorption optical modulator 46, and a modulator driver 50. The continuous wave laser 44 and the electroabsorption optical modulator 46 are integrated into a single semiconductor chip included in the module.

In one embodiment, light source controller 38 (see FIG. 1) is a rasterizer of the type disclosed in Teitzel et al. U.S. Pat. No. 5,533,170, incorporated herein by reference, or a modification thereof. In this embodiment, light source controller 38 converts data defining a pattern to be transferred to a substrate (not shown) by a conventional electron beam lithography process to gray scale pixel values. Each pixel value corresponds, in one implementation, to a desired dose of electrons to be delivered to a corresponding location (pixel) on the substrate by an electron beam supplied by gated photocathode 2a or 2b. One of ordinary skill in the art will recognize that the rasterizer disclosed in U.S. Pat. No. 5,533,170 may be routinely modified to interface with, e.g., electroabsorption optical modulators and to take full advantage of their speed. Such conventional modifications include, e.g., removing radio frequency signal generators required for operation of AOMs.

In an implementation utilizing an electroabsorption optical modulator, as in FIG. 3, modulator driver 50 is electrically coupled to controller 38 by bus 40 to receive electrical signals representing the pixel values. In one (digital) implementation, each pixel value received by modulator driver 50 is received as a sequence of bits each of which represents a modulation voltage to be applied by modulator driver 50 to electroabsorption optical modulator 46. In one 16 gray level writing strategy, for example, each pixel is represented by 16 serially transmitted consecutive bits. In this implementation, bit values of one and zero represent two different modulation voltage levels. Electroabsorption optical modulator 46 accordingly switches the power of its output between a high value, e.g. a maximum power, and a low value, e.g. a minimum power, depending upon the values of the bits.

The high modulation rates achievable with electroabsorption optical modulators increase the pixel value throughput compared, e.g., to conventional electron beam lithography systems. For example, the Lucent Technologies E2580-series electroabsorption modulated lasers referred to above can operate at 10 gigabits per second (Gbits/sec). A digital implementation using a 16 gray level writing strategy in which each bit represents one gray level, as described above, requires at most 16 bits per pixel. At 10 Gbits/sec, the resulting pixel rate of at least 625 Mpixels/sec exceeds the pixel rates of conventional single-electron beam lithography systems by a factor of two, and the pixel rate increases linearly with each additional gated photocathode that is used in a specific implementation.

In another digital implementation, the duty cycle of the modulation voltage provided by modulator driver 50 to electroabsorption optical modulator 46, i.e. the period of time during which the modulation voltage is at the voltage level corresponding to the value of a bit, is controlled to create additional gray levels. For example, four different duty cycles can be combined with 16 bits per pixel to create 64 gray levels. Alternatively, 16 different duty cycles can be combined with 4 bits per pixel to create 64 gray levels at four times the pixel rate.

In an alternative implementation, modulator driver 50 receives pixel values from light source controller 38 as analog electrical signals and provides corresponding analog modulation voltages to electroabsorption optical modulator 46. Electroabsorption optical modulator 46 accordingly controls the power of its output to be any of a continuous series of values between a maximum power and a minimum power.

Referring again to FIG. 1, optical fiber 42a, which enters vacuum chamber 4 through conventional optical fiber vacuum feedthrough 54a, outputs the light beam supplied by light source 36a to light detector 56a. Light detector 56a is electrically coupled by electrical lines 58a and 28 to output terminal 30 of HV power supply 32 at voltage $V_1$, and electrically coupled by electrical lines 60a and 62 to output terminal 64 of HV power supply 32 at DC voltage $V_2$. Electrical line 62 also enters vacuum chamber 4 through conventional HV vacuum feedthrough 34. In one implementation, voltage $V_2$ is more negative than voltage $V_1$ by about 5 volts. In response to the modulated light beam output by optical fiber 42a, light detector 56a outputs a corresponding electrical signal via electrical line 66a to electrical switching circuit 68a.

Electrical switching circuit 68a is electrically coupled by electrical lines 70a and 28 to output terminal 30 of HV power supply 32 at voltage $V_1$, and electrically coupled by electrical lines 72a and 62 to output terminal 64 of HV power supply 32 at voltage $V_2$. In response to the electrical signal output by light detector 56a, electrical switching circuit 68a switches an output voltage it supplies via electrical line 74a to gate electrode 16a.

Figure 4A:
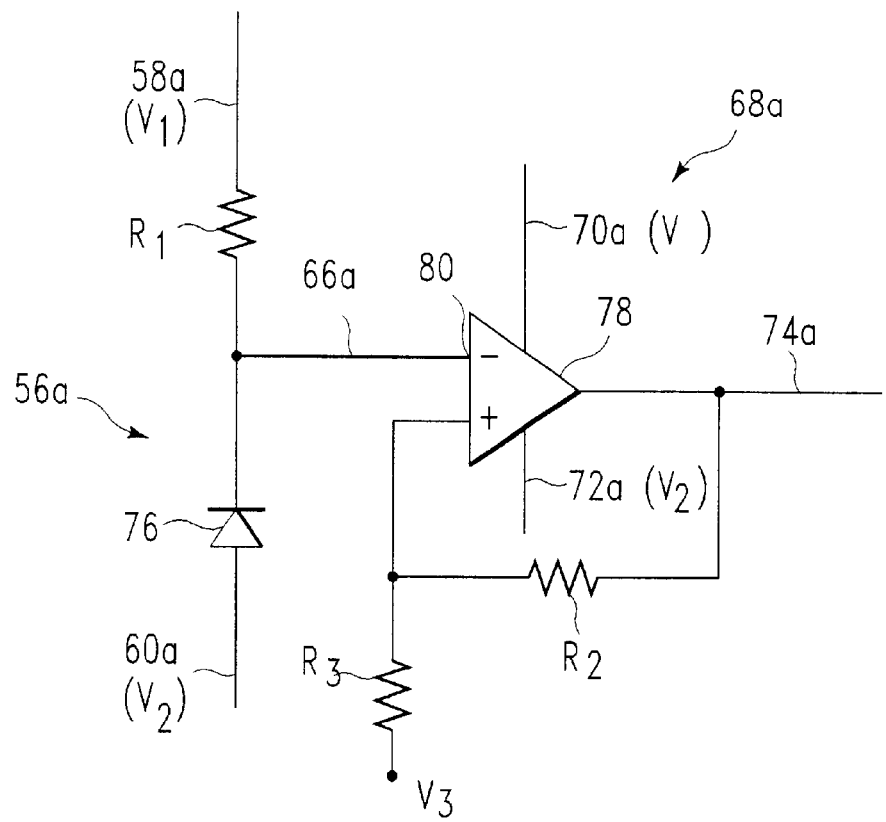
FIG. 4A schematically illustrates a light detection and electrical switching circuit in accordance with one embodiment.

If the output signal of light source 36a is digitally modulated, then detector 56a and electrical switch 68a are implemented, e.g., as illustrated in FIG. 4A. Detector 56a is, e.g., a high speed PIN photodiode 76 electrically coupled to load resistor $R_1$ and reverse biased by voltage $V_1$ applied via electrical line 58a to $R_1$ and by voltage $V_2$ applied via electrical line 60a. Upon exposure to incident light, photodiode 76 generates an output voltage across $R_1$ proportional to the intensity of the incident light. Electrical switching circuit 68a includes, e.g., a high speed operational amplifier (op-amp) 78 electrically coupled to receive power from HV power supply 32 via electrical lines 70a and 72a, and configured as a Schmitt-trigger comparator with resistor $R_2$ electrically coupled between its output and a first input, resistor $R_3$ electrically coupled between the first input and a voltage $V_3$, derived from voltages $V_1$ and $V_2$ by conventional methods, and a second input 80 electrically coupled to electrical line 66a at the voltage generated across $R_1$ by photodiode 76. Op-amp 78 switches its output voltage, electrically coupled by electrical line 74a to gate electrode 16a (not shown in FIG. 4A), from one supply rail (e.g., $V_1$) to the other (e.g., $V_2$) when the voltage at its second input 80 crosses a trigger value determined by the values of $R_2$, $R_3$, and $V_3$. The intensity of an electron beam output by photocathode 2a is thereby switched between an "on" level (gate electrode 16a at $V_1$) and an "off" level (gate electrode 16a at $V_2$).

Figure 4B:
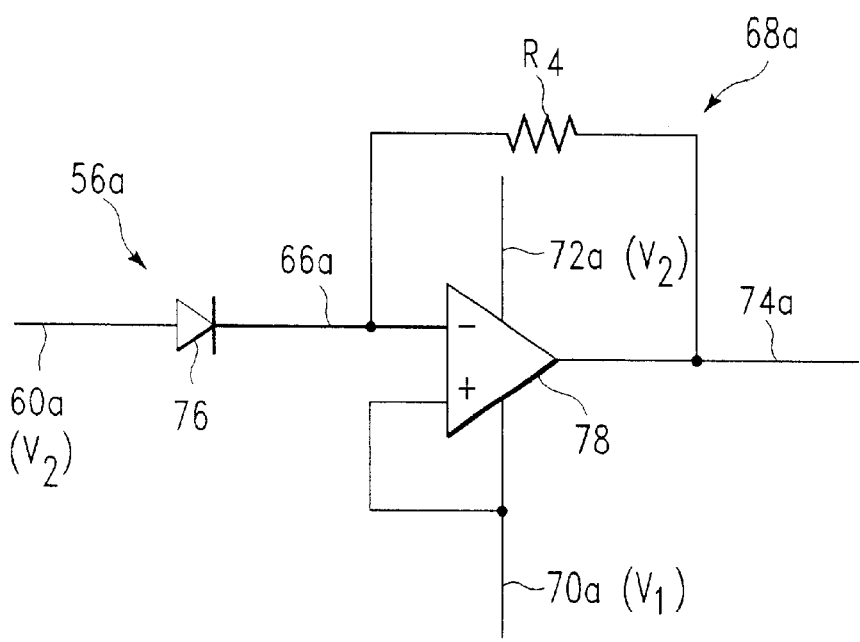
FIG. 4B schematically illustrates a light detection and electrical switching circuit in accordance with a second embodiment.

Alternatively, if the output of light source 36a has an analog modulation, then detector 56a and electrical switching circuit 68a are implemented, e.g., as illustrated in FIG. 4B. Detector 56a is, e.g., a high speed PIN photodiode 76 reverse biased by $V_2$ applied via electrical line 60a. Upon exposure to light, photodiode 76 generates a photocurrent proportional to the intensity of the incident light in electrical line 66a. Switching circuit 68a is, e.g., a high speed op-amp 78 electrically coupled to receive power from HV power supply 32 via electrical lines 70a and 72a, and configured as a transimpedance amplifier with a first input electrically coupled to electrical line 70*a* at voltage $V_1$, a feedback resistor $R_4$ electrically coupled between the op-amp's output and a second input, and the second input electrically coupled by electrical line 66*a* to photodiode 76. Op-amp 78 supplies an output voltage, electrically coupled by electrical line 74*a* to gate electrode 16*a* (not shown in FIG. 4B), proportional to the photocurrent and ranging from about $V_1$ to about $V_2$. The intensity of an electron beam output by photocathode 2*a* is thereby controlled to be any of a continuous series of levels from "on" (gate electrode 16*a* at $V_1$) to "off" (gate electrode 16*a* at $V_2$).

Light detector 56*a* has a response time less than about 10 ns, preferably less than about 1 ns, more preferably less than about 100 ps. Such response times are obtained with, e.g., commercially available high speed photodiodes. In other implementations, light detector 56*a* includes, e.g., a phototransistor or a photoresistor in place of photodiode 76, and light detector 56*a* and switching circuit 68*a* are suitably modified to accommodate such a substitution.

Switching circuit 68*a* preferably has a slew rate greater than about 1000 volts per microsecond, more preferably greater than about 5000 volts per microsecond. Such slew rates are obtained with, e.g., commercially available high speed op-amps. In an implementation in which the voltage on, e.g., gate electrode 16*a* is modulated by 5 volts as described above, these slew rates provide switching circuit response times of less than about 5 ns and less than about 1 ns, respectively. In other implementations, the op-amp circuit in FIG. 4A is replaced with, e.g., a monolithic comparator, or the function of the op-amp in either FIG. 4A or FIG. 4B is replicated with discrete components such as transistors, resistors, capacitors, and inductors. The inventors believe that such a switching circuit built from discrete components would provide slew rates an order of magnitude greater those obtained from commercially available high speed op-amps, and thus response times an order of magnitude less than those cited above. Alternatively, faster switching circuit response times are obtained for the same slew rates if, e.g., an electron beam output by gated photocathode 2*a* is controlled by a voltage difference between photoemitter 8*a* and gate electrode 16*a* less than 5 volts.

Referring again to FIG. 1, a voltage on gate electrode 16*b* of gated photocathode 2*b* is similarly controlled optically to thereby control an intensity of an electron beam supplied by photocathode 2*b*. In particular, in one embodiment light source 36*b* receives electrical signals from light source controller 38 via bus 40 and in response outputs into optical fiber 42*b* a light beam having an intensity modulation corresponding to a desired modulation of the electron beam output from gated photocathode 2*b*. Optical fiber 42*b*, which enters vacuum chamber 4 via conventional optical fiber feedthrough 54*b*, outputs the light beam supplied by light source 36*b* to light detector 56*b*.

Light detector 56*b* is electrically coupled by electrical lines 58*b* and 28 to output terminal 30 of HV power supply 32 at voltage $V_1$, and electrically coupled by electrical lines 60*b* and 62 to output terminal 64 of HV power supply 32 at DC voltage $V_2$. In response to the modulated light beam output by optical fiber 42*b*, light detector 56*b* outputs a corresponding electrical signal via electrical line 66*b* to electrical switching circuit 68*b*.

Electrical switching circuit 68*b* is electrically coupled by electrical lines 70*b* and 28 to output terminal 30 of HV power supply 32 at voltage $V_1$, and electrically coupled by electrical lines 72*b* and 62 to output terminal 64 of HV power supply 32 at voltage $V_2$. In response to the electrical signal output by light detector 56*b*, electrical switching circuit 68*b* switches an output voltage it supplies via electrical line 74*b* to gate electrode 16*b*. The intensity of an electron beam supplied by photocathode 2*b* is thereby switched between an "on" level and an "off" level in a digital implementation, or controlled to be any of a continuous series of levels from "on" to "off" in an analog implementation. Though, for convenience of illustration only, a portion of line 74*b* is not shown in FIG. 1, line 74*b* forms a continuous electrical connection between gate electrode 16*b* and the output of electrical switching circuit 68*b*.

Optical control of the switching voltages on gate electrodes 16*a* and 16*b* as described above electrically isolates these high voltage signals from the ground-referenced low voltage signals output by light source controller 38 to represent, e.g., pixel values. In particular, light detectors 56*a*–56*b*, electrical switching circuits 68*a* and 68*b*, photoemitters 8*a*–8*b*, and gate electrodes 16*a*–16*b* "float" at high voltages of about, e.g., −50 kV. In contrast, light sources 36*a*–36*b* and light source controller 38 operate primarily at voltages near ground voltage and are electrically insulated by optical fibers 42*a* and 42*b* from those components floating at high voltage.

Electrically isolating the high voltage components inside vacuum chamber 4 improves operator safety and convenience. Moreover, in the absence of such optical control of the switching voltages, each independent gated photocathode 2*a*–2*b* might require a separate radiofrequency (RF) high voltage vacuum feedthrough into vacuum chamber 4. (RF here refers to the modulation frequency of the signal as being very high, not to free space radio transmissions). Such high voltage RF feedthroughs are replaced in FIG. 1, for example, by optical fiber feedthroughs 54*a* and 54*b*. The complexity of designing and fabricating a gated photocathode electron source are thereby reduced. In addition, optical control of the switching voltages reduces the length over which RF high voltage electrical signals are transmitted to gate electrodes 16*a*–16*b*, and thus reduces RF cross-talk between those signals.

Figure 5:
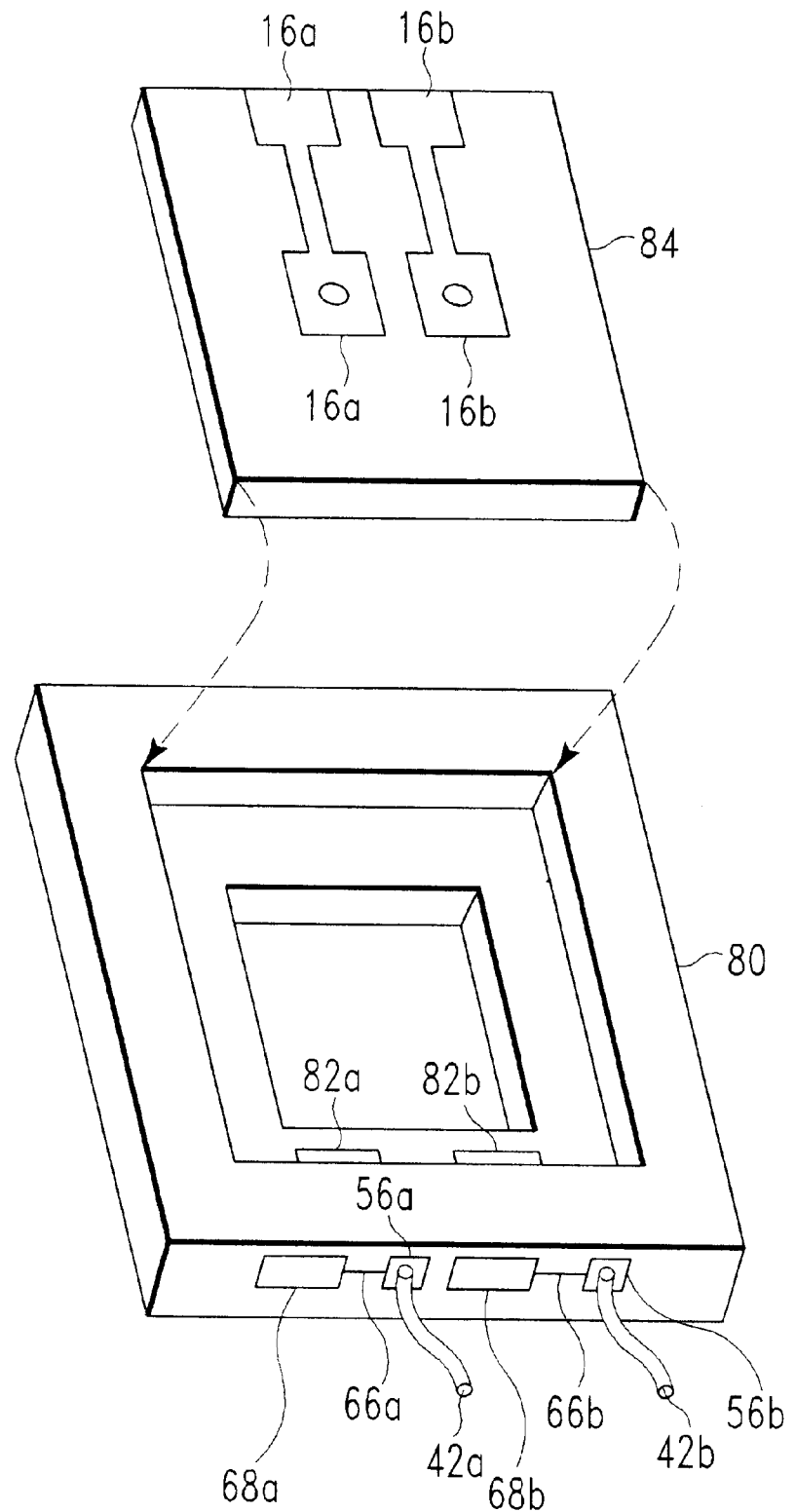
FIG. 5 illustrates a photocathode mount and a photocathode socket in accordance with one embodiment.

The lengths over which RF high voltage signals are transmitted to gate electrodes 16*a*–16*b* are further reduced in an implementation illustrated in the exploded view of FIG. 5, in which light detectors 56*a*–56*b* and switching circuits 68*a*–68*b* are mounted directly on a photocathode socket 80. Photocathode socket 80 is, e.g., machined to a size of about 2 to about 5 cm to a side from, e.g., a machineable vacuum compatible insulator such as Macor® available from Corning Incorporated or Vespel® available from E. I. du Pont de Nemours and Company. Light detectors 56*a*–56*b* and switching circuits 68*a*–68*b* are mounted to socket 80 with, e.g., vacuum compatible epoxy adhesive. Note that the dimensions of the various elements depicted in FIG. 5 are not to scale. Switching circuits 68*a*–68*b* are electrically coupled to contact pads 82*a*–82*b*, respectively, on socket 80. Photocathode mount 84 is installed in socket 80 such that gate electrode contact pads 86*a*–86*b*, electrically coupled to gate electrodes 16*a*–16*b*, respectively, make electrical contact with contact pads 82*a*–82*b*, respectively. Photocathode mount 80 includes other components of photocathodes 2*a*–2*b* not shown in FIG. 5 such as, e.g., photoemitters 8*a*–8*b*. Though FIG. 5 shows components of two gated photocathodes, in other implementations socket 80 and mount 84 include components of more or fewer than two gated photocathodes. The assembled photocathode socket 80 and mount 84 are installed, e.g., in vacuum chamber 4 of FIG. 1 in place of the individual gated photocathodes 2*a*–2*b*, light detectors 56*a*–56*b*, and switching circuits 68*a*–68*b* shown therein.

Although FIG. 1 shows HV power supply 32 having high voltage output terminals 30 and 64 supplying two high voltages $V_1$ and $V_2$, other embodiments utilize additional high voltages. For example, in one embodiment HV power supply 32 supplies high voltages $V_1 \sim -50$ kV, $V_2 \sim V_1 - 5$ volts, and $V_4 \sim V_1 + 5$ volts. Light detectors 56a–56b and switching circuits 68a–68b are each electrically coupled to terminals of HV power supply 32 at, e.g., voltages $V_2$ and $V_4$. Photoemitters 8a–8b are, e.g., each electrically coupled to a terminal of HV power supply 32 at voltage $V_1$, and gate electrodes 16a–16b are, e.g., each electrically coupled to switching circuits 68a–68b, respectively, at a voltage switched between $V_2$ and $V_4$. The intensity of, e.g., an electron beam supplied by gated photocathode 2a is thereby modulated between an "off" level (gate electrode 16a at $V_2 \sim V_1 - 5$ volts) and a "full on" level (gate electrode 16a at $V_4 \sim V_1 + 5$ volts).

Figure 6:
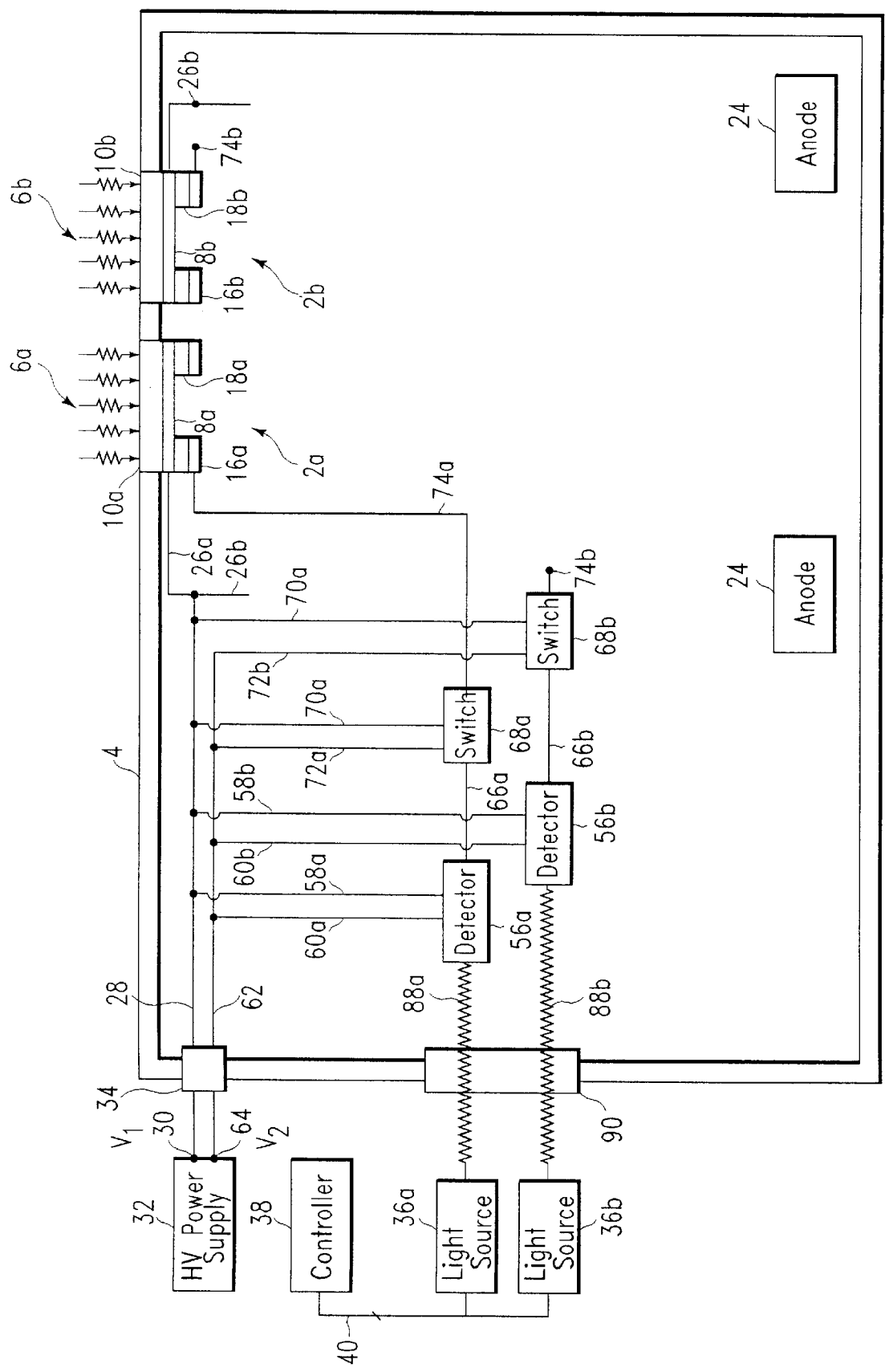
FIG. 6 is an illustration of an electron beam source apparatus utilizing an optical port in accordance with one embodiment.

Referring to FIG. 6, in another embodiment light sources 36a–36b output light beams 88a–88b incident on light detectors 56a–56b, respectively, through optical port 90. (Hence no optical fiber feedthrough is needed.) Optical port 90 is, e.g., a conventional transmissive optical flat (window) or lens conventionally mounted through the wall of vacuum chamber 4. Additional optical elements, e.g., lenses and mirrors, are incorporated in the optical paths of light beams 88a–88b in other implementations. In one implementation, light detectors 56a–56b are included in a light detector array such as, e.g., a conventional photodiode array. The optical paths of light beams 88a–88b electrically isolate high voltage components, e.g., detectors 56a–56b, from, e.g., light source controller 38. Optical control of voltages on gate electrodes 16a–16b in this embodiment is otherwise accomplished as disclosed above. Advantageously, the number of gated photocathodes in vacuum chamber 4 can be increased without adding optical fiber feedthroughs to accommodate corresponding additional optical signals. Such additional optical signals are, instead, transmitted through optical port 90.

Figure 7:
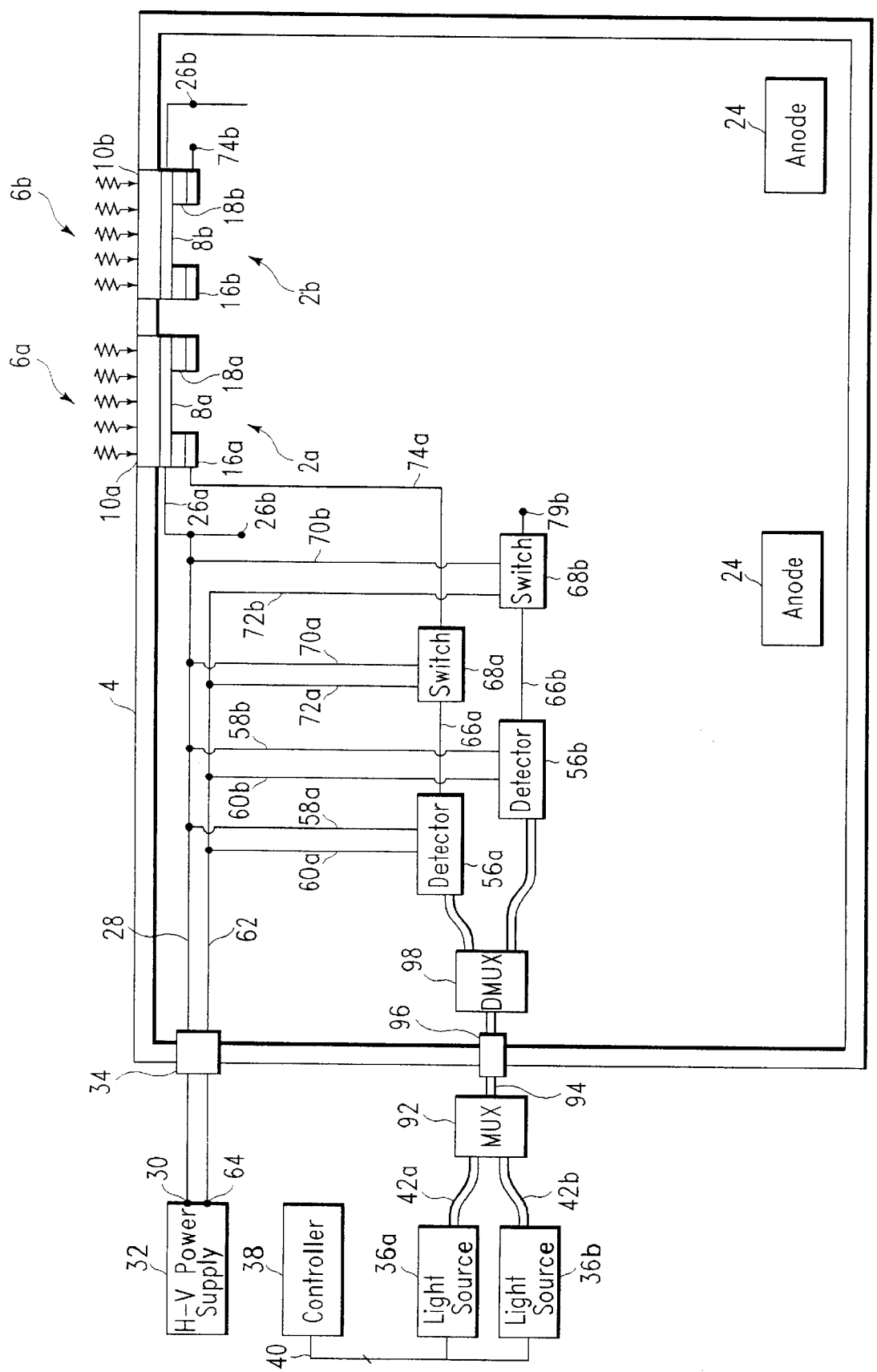
FIG. 7 is an illustration of an electron beam source apparatus utilizing an optical multiplexer and an optical demultiplexer in accordance with one embodiment.

Referring to FIG. 7, in another embodiment light sources 36a–36b output light beams having different wavelengths into optical fibers 42a–42b, respectively. Optical fibers 42a–42b output the light beams supplied by light sources 36a–36b into conventional optical multiplexer 92, which combines the light beams and outputs them into optical fiber 94. Optical fiber 94, which enters vacuum chamber 4 through conventional optical fiber feedthrough 96, outputs the combined light beams into conventional optical demultiplexer 98. Optical demultiplexer 98 separates the light beams supplied by light sources 36a–36b and outputs them through optical fibers 100a–100b to light detectors 56a–56b, respectively. Optical control of voltages on gate electrodes 16a–16b in this embodiment is otherwise accomplished as disclosed above.

Figure 8:
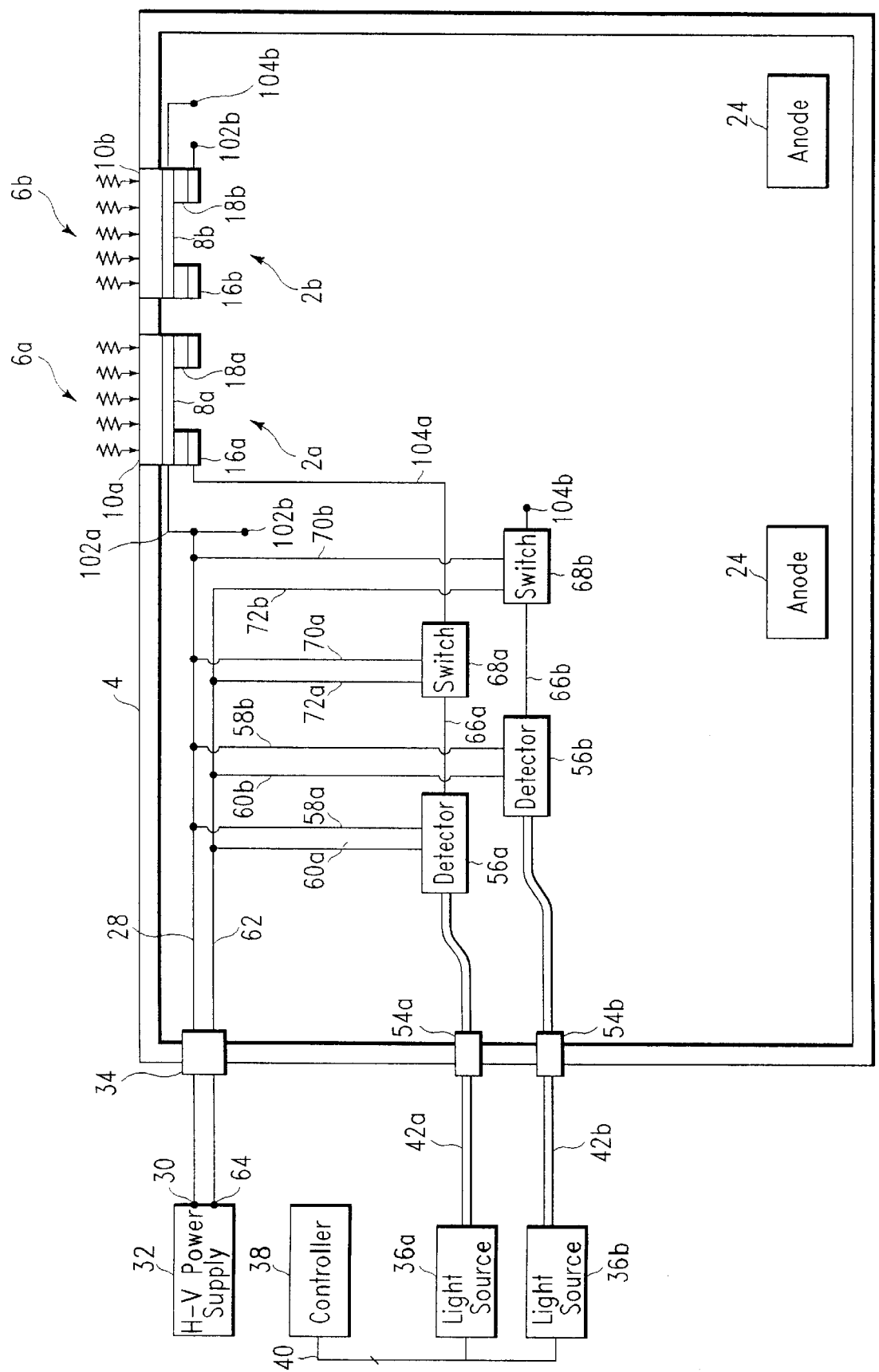
FIG. 8 is an illustration of an electron beam source apparatus having modulated photoemitter voltages in accordance with one embodiment.

In another embodiment, illustrated in FIG. 8, voltages on photoemitters 8a–8b are controlled optically to thereby control intensities of electron beams supplied by gated photocathodes 2a–2b, respectively. In this embodiment, gate electrode 16a is electrically coupled by electrical lines 102a and 62 to output terminal 64 of HV power supply 32 at voltage $V_2$. Gate electrode 16b is similarly electrically coupled by electrical lines 102b and 62 to output terminal 64 at voltage $V_2$. Photoemitters 8a–8b are electrically coupled by electrical lines 104a and 104b respectively to switching circuits 56a–56b respectively at voltages switched between about $V_1$ and about $V_2$. The intensity of, e.g., an electron beam supplied by gated photocathode 2a is thereby modulated between an "off" level (photoemitter 8a at $V_1$) and an "on" level (photoemitter 8a at $V_2$). Optical control of voltages on photoemitters 8a–8b in this embodiment is otherwise accomplished similarly to optical control of voltages on gate electrodes 16a–16b disclosed above.

This disclosure is illustrative and not limiting. Further modifications will be apparent to one skilled in the art in light of this disclosure and are intended to fall within the scope of the appended claims.

We claim:

1. An apparatus comprising:

a transmissive substrate;

a photoemitter on the substrate;

a gate insulator on the photoemitter;

a gate electrode on the gate insulator;

a housing enclosing the photoemitter and the gate electrode;

a light source located outside the housing; and a detector located in the housing to receive light from the light source, the detector electrically coupled to control a voltage applied to one of the gate electrode or the photoemitter;

wherein the light source and the detector cooperate to communicate therebetween signals having transition times less than about 10 nanoseconds.

2. The apparatus of claim 1, wherein the transmissive substrate is formed from a material selected from the group consisting of glass, fused silica, and sapphire.

3. The apparatus of claim 1, wherein the photoemitter is formed from a material selected from the group consisting of gold, aluminum, magnesium, and carbide.

4. The apparatus of claim 1, wherein the housing is a vacuum chamber.

5. The apparatus of claim 1, wherein the light source comprises a source of coherent light.

6. The apparatus of claim 5, wherein the light source further comprises an optical modulator coupled to modulate an output of the source of coherent light.

7. The apparatus of claim 6, wherein the optical modulator is an electroabsorption optical modulator.

8. The apparatus of claim 1, further comprising one of a transmissive portion or an optical fiber in a wall of the housing for passage of the light from the light source to the detector.

9. The apparatus of claim 1, further comprising a high voltage source coupled to one of the gate electrode or the photoemitter.

10. The apparatus of claim 1, wherein the detector is integrated with the photoemitter.

11. The apparatus of claim 1, wherein the signals have transition times less than about 1 nanosecond.

12. The apparatus of claim 1, wherein the signals are digital signals.

13. The apparatus of claim 1, wherein the signals are analog signals.

14. The apparatus of claim 1, further comprising:

a second transmissive substrate;

a second photoemitter on the second substrate and in the housing;

a second gate insulator on the second photoemitter;

a second gate electrode on the second gate insulator and in the housing;

a second light source located outside the housing; and a second detector located in the housing to receive light from the second light source, the second detector electrically coupled to control a voltage applied to one of the second gate electrode or the second photoemitter;

wherein the second light source and the second detector cooperate to communicate therebetween signals having transition times less than about 10 nanoseconds.

15. The apparatus of claim 14, further comprising an optical multiplexer coupled to combine light output from the light source and light output from the second light source.

16. A method of controlling an electron beam supplied by an electron source having a photoemitter and a gate electrode located inside a housing, comprising the acts of:

directing a beam of light from outside the housing to inside the housing;

detecting a portion of the beam of light inside the housing, thereby receiving a signal having transition times less than about 10 nanoseconds; and controlling a difference between a voltage applied to the photoemitter and a voltage applied to the gate electrode in response to the signal.

17. The method of claim 16, wherein directing a beam of light comprises optically modulating the beam of light with an optical modulator.

18. The method of claim 16, wherein the signal is a digital signal.

19. The method of claim 16, wherein the signal is an analog signal.

20. The method of claim 16, wherein the signal has transition times less than about 1 nanosecond.

21. The method of claim 16, further comprising the acts of:

directing a second beam of light from outside the housing to inside the housing;

detecting a portion of the second beam of light inside the housing, thereby receiving a second signal having transition times less than about 10 nanoseconds; and controlling a difference between a voltage applied to a second photoemitter inside the housing and a voltage applied to an associated second gate electrode inside the housing in response to the second signal.

22. The method of claim 21, further comprising the acts of combining the first beam of light and the second beam of light.

* * * * *